(12) United States Patent
Pickles et al.

(10) Patent No.: US 6,413,111 B1
(45) Date of Patent: Jul. 2, 2002

(54) PICK UP CAP USED FOR AN ELECTRICAL SOCKET

(75) Inventors: Charles S. Pickles, York, PA (US); Fang-Chu Liao; Hsiang-Ping Chen, both of Tu-Chen (TW)

(73) Assignee: Hon Hai Precision Ind. Co., Ltd., Taipei Hsien (TW)

( * ) Notice: Subject to any disclaimer, the term of this patent is extended or adjusted under 35 U.S.C. 154(b) by 0 days.

(21) Appl. No.: 10/013,381

(22) Filed: Dec. 7, 2001

(51) Int. Cl.[7] ................................................. H01R 4/50
(52) U.S. Cl. ...................................... 439/342; 439/259
(58) Field of Search ................................. 439/342, 259, 439/265, 263, 266, 268

(56) References Cited

U.S. PATENT DOCUMENTS

| | | | | |
|---|---|---|---|---|
| 5,722,848 A | * | 3/1998 | Lai et al. ...................... | 439/342 |
| 5,833,483 A | * | 11/1998 | Lai et al. ...................... | 439/342 |
| 6,042,413 A | * | 3/2000 | Hsiao et al. ................... | 439/342 |
| 6,046,547 A | * | 4/2000 | Barabi ......................... | 324/755 |
| 6,065,990 A | * | 5/2000 | McHugh et al. ............ | 439/342 |
| 6,113,411 A | * | 9/2000 | Lu et al. ...................... | 439/342 |
| 6,152,757 A | * | 11/2000 | Szu ............................. | 439/342 |
| 6,186,816 B1 | * | 2/2001 | Lu et al. ...................... | 439/342 |
| 6,210,196 B1 | * | 4/2001 | Wang et al. ................. | 439/342 |
| 6,231,367 B1 | * | 5/2001 | Hsiao et al. ................. | 439/342 |
| 6,243,267 B1 | * | 6/2001 | Chuang ........................ | 361/704 |
| 6,264,490 B1 | * | 7/2001 | Lemke et al. ............... | 439/342 |

\* cited by examiner

Primary Examiner—Tho D. Ta
Assistant Examiner—Rhuong Nguyen
(74) Attorney, Agent, or Firm—Wei Te Chung

(57) ABSTRACT

A CPU socket assembly (1) is to be appropriately mounted a circuit board by a vacuum suction device and includes a CPU socket (10) and a pick up cap (20) to be horizontally attached to the CPU socket. The socket has a cover (14) defines a central opening. (11) and a plurality of recesses around the central opening in a bottom surface (15) thereof. The pick up cap is horizontally assembled with the cover and forms in a bottom face thereof an embossment (29) and a pair of latching arms (26) corresponding to the recesses, respectively. The embossment is firstly latched with a corresponding recess and the latching arms are then fitted with the other corresponding recesses of the cover, thereby reliably attaching the pick up cap to the cover.

7 Claims, 6 Drawing Sheets

PICK UP CAP USED FOR AN ELECTRICAL SOCKET

BACKGROUND OF THE INVENTION

1. Field of the Invention

The present invention relates to an electrical socket, and particularly to a pick up cap used for manipulating such an electrical socket onto an underlying electronic device.

2. Description of Prior Art

Electronic components, such as CPU sockets, are often appropriately positioned on an underlying printed circuit board (PCB) by means of a vacuum suction device. Since the cover of the CPU socket has a plurality of through holes in substantial entire surface thereof, a pick up cap is attached thereon and the vacuum suction device is manipulated on a top flat surface of the pick up cap so as to properly position the CPU socket onto the PCB. Such pick up caps are disclosed in U.S. Pat. Nos. 5,651,684, and 5,819,404. A pick up cap generally has a body plate covering the CPU socket and a plurality of latching mechanisms depending from the body plate for vertical insertion into apertures defined in the CPU socket by an insertion force. However, some problems are initiated due to such vertical insertion force on the pick up cap. On one hand, if the insertion force tends to be large, the extraction force of the pick up cap from the electrical socket is too large. On the other hand, if the insertion force is too small, the pick up cap can not effectively latch with the CPU socket. Additionally, the latching mechanisms of the pick up cap are easily damaged due to such a vertical insertion.

Hence, an improved pick up cap used for an electrical socket is required to overcome the disadvantages of the prior art.

BRIEF SUMMARY OF THE INVENTION

A first object of the present invention is to provide a pick up cap for being effectively and reliably manipulated on a CPU socket during assembling the CPU socket with a PCB.

A second object of the present invention is to provide an improved method for assembling a pick up cap with a CPU socket.

A CPU socket assembly in accordance with the present invention is to be appropriately mounted a circuit board by a vacuum suction device. The socket assembly comprises a CPU socket and a pick up cap horizontally attached to the CPU socket. The socket has a base retained a plurality of terminals and a slidable cover covering the base. The cover defines a central opening and a plurality of recesses beside and communicated with the central opening in a bottom surface thereof. The pick up cap is horizontally assembled with the cover during the CPU socket being arranged onto the circuit board. The pick up cap forms in a bottom face thereof an embossment and a pair of latching arms opposite to the embossment. The embossment is firstly inserted into a corresponding recess of the cover and the latching arms are then latched with the other corresponding recesses of the cover.

Other objects, advantages and novel features of the invention will become more apparent from the following detailed description of the present embodiment when taken in conjunction with the accompanying drawings.

DETAILED DESCRIPTION OF THE INVENTION

Figure 1:
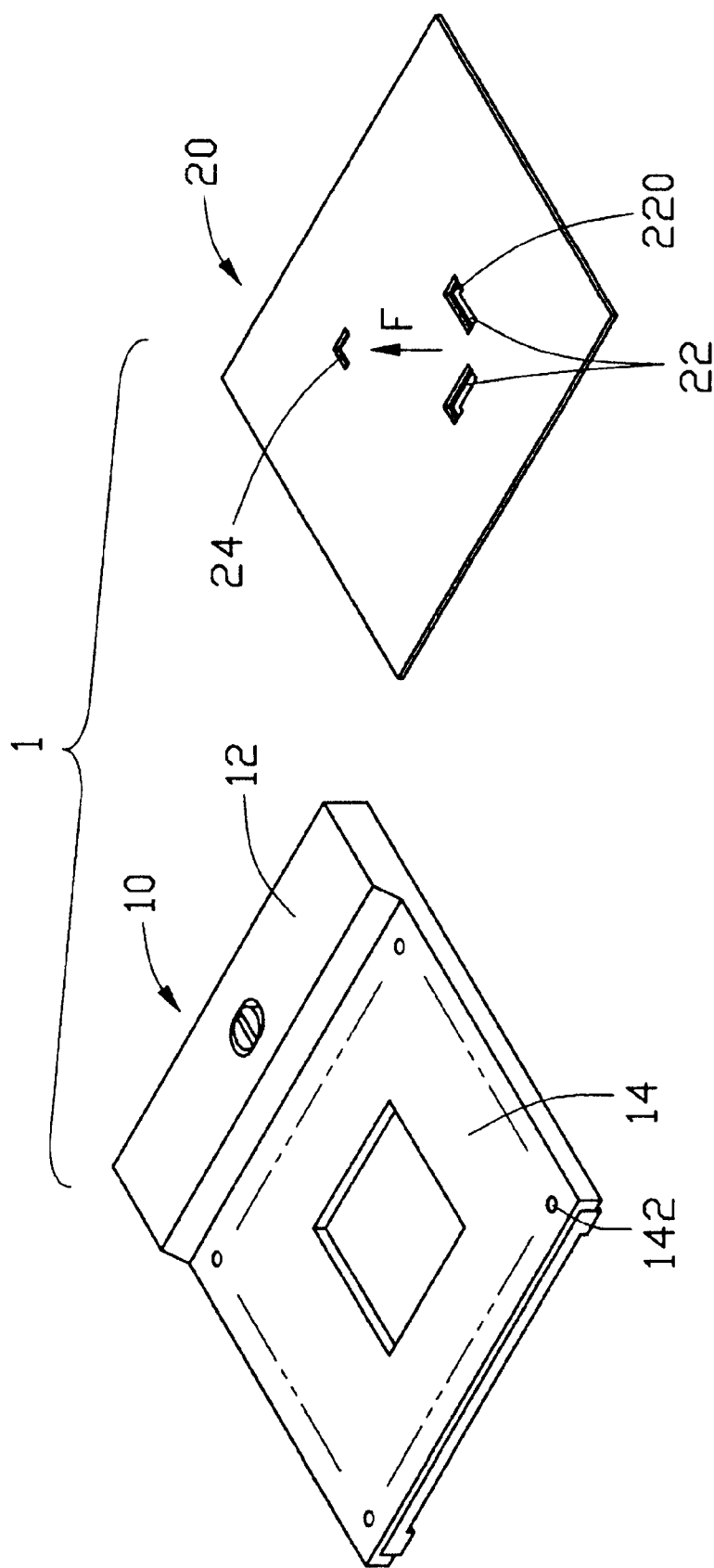
FIG. 1 is an exploded perspective view of an electrical socket assembly in accordance with f the present invention.

Reference will be made to drawings for detailed description of the present invention. Referring to FIG. 1 first, a CPU socket assembly 1 in accordance with the present invention includes a CPU socket 10 and a pick up cap 20 to be horizontally fastened onto the socket 10 during assembling the socket 10 with an underlying circuit board (not shown).

Figure 2:
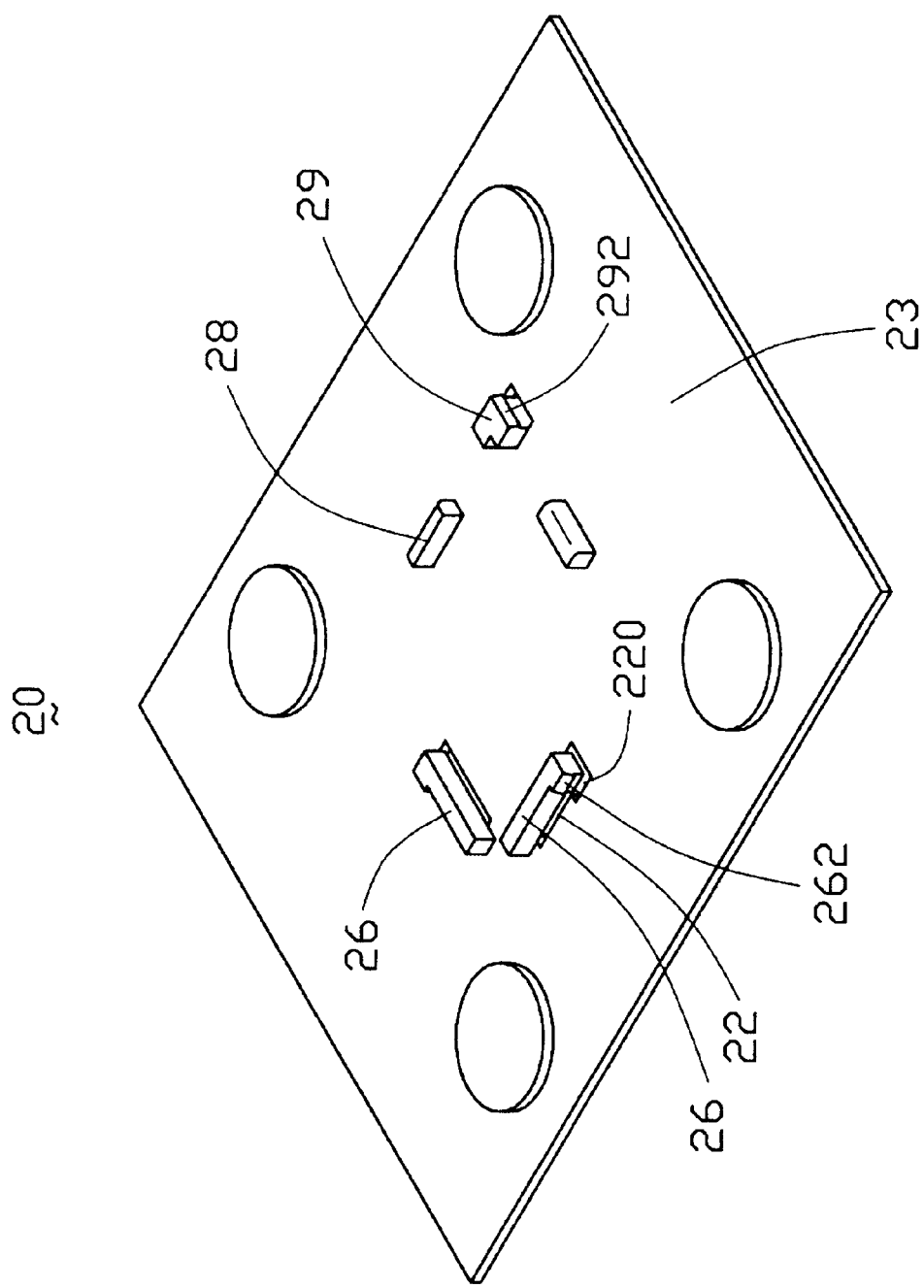
FIG. 2 is an enlarged bottom perspective view of a cover of the electrical socket assembly of FIG. 1.

The CPU socket 10 has a non-conductive base 12 receiving a plurality of conductive contacts (not shown) for soldering to the circuit board, and a slidable cover 14 mounted on the base 12. Further referring to FIG. 2, a bottom perspective view of the slidable cover 14 is shown. The cover 14 defines a central square-shaped opening 11 surrounded by four inner side edges 13 of the cover 14. An array of pin holes 142 are defined around the central opening 11 for insertion of corresponding pins of the CPU (not shown). The bottom face 15 defines an "L"-shaped recess 16 at a boundary portion of two adjacent side edges 13, and a pair of cutouts 17 in the other two adjacent side edges 13. The recess 16 and the cutouts 17 are all communicated with the central opening 11.

Figure 3:
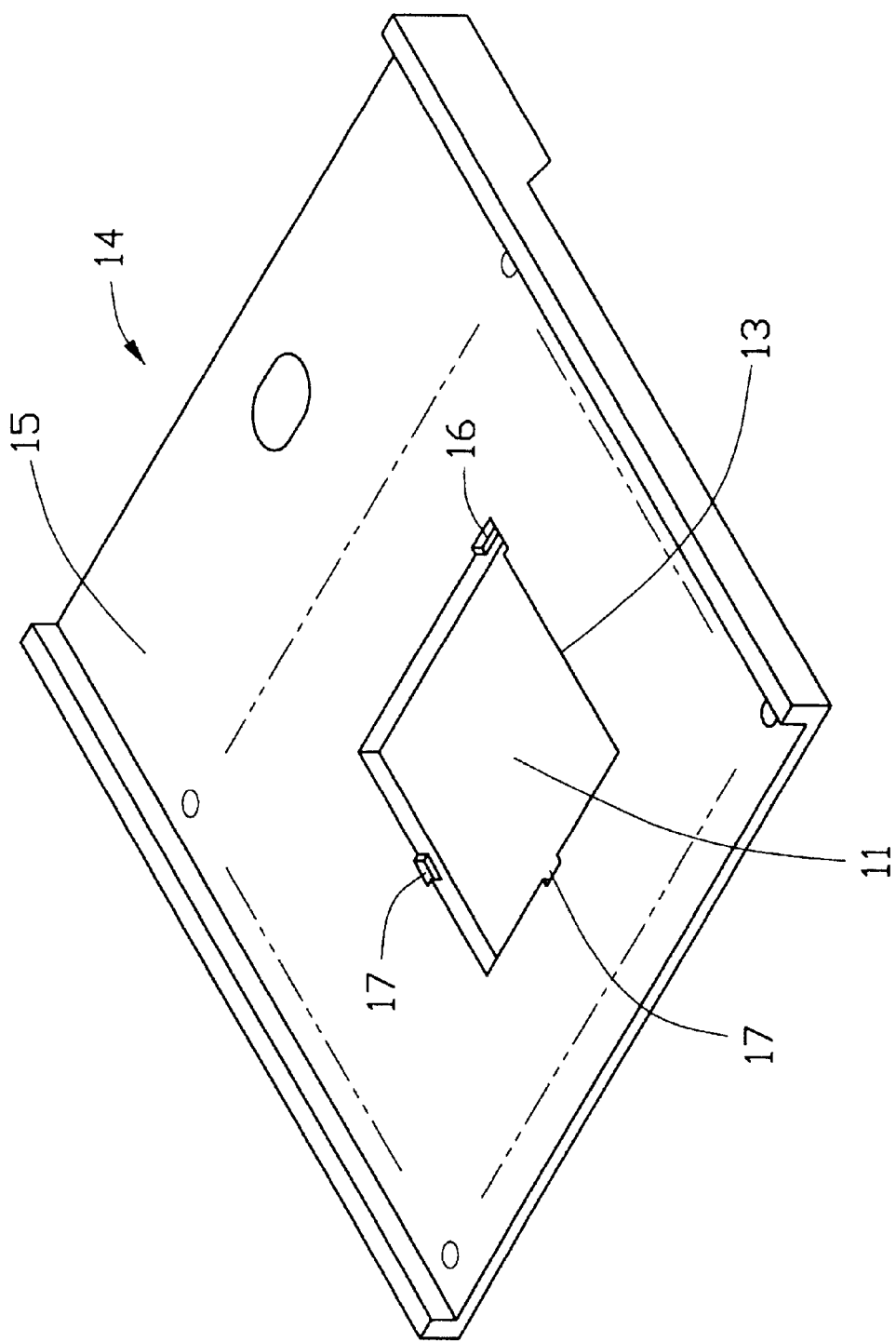
FIG. 3 is an enlarged bottom perspective view of a pick up cap of the electrical socket assembly of FIG. 1.

Referring to FIGS. 1 and 3, the pick up cap 20 defines a pair of slots 22 and an "L"-shaped slit 24 corresponding to the two connected side edges 13 defining the cutouts 17 and the recess 16 of the cover 12, respectively. Both the slots 22 and the slit 24 are extended through opposite top and bottom surfaces 21 and 23 of the pick up cap 20. Each slot 22 forms a recessed portion 220 at a tip end thereof remote to the other slot 22. A resilient beam 26 is extended from the other tip end of the each slot 22 and located correspondingly below the slot 22. The resilient beam 26 forms a latching tab 262 at one end portion thereof and extending toward the recessed portion 220 of the slot 22. Additionally, an embossment 29 is correspondingly formed below the slit 24 and has an "L"-shaped protrusion 292 extending from a bottom face 294 thereof for latching in the "L"-shaped recess 16 of the slidable cover 10. Furthermore, a pair of elongate blocks 28 are formed beside the embossment 29 for abutting against the other two connected side edges 13 defining the recess 16.

Figure 4:
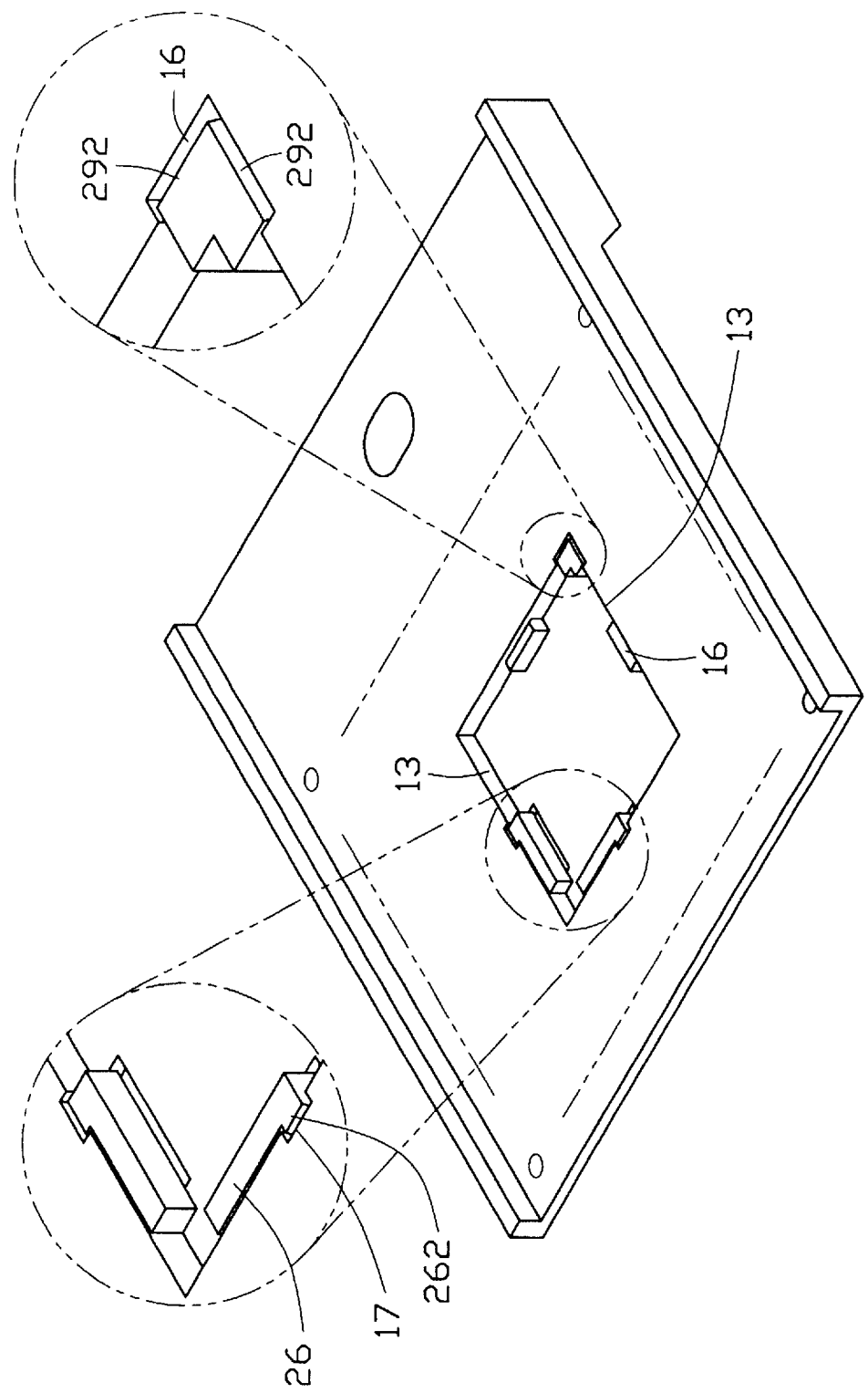
FIG. 4 is a perspective view of the pick up cap of FIG. 3 assembled with the cover of FIG. 2 having partial enlarged view.
Figure 5:
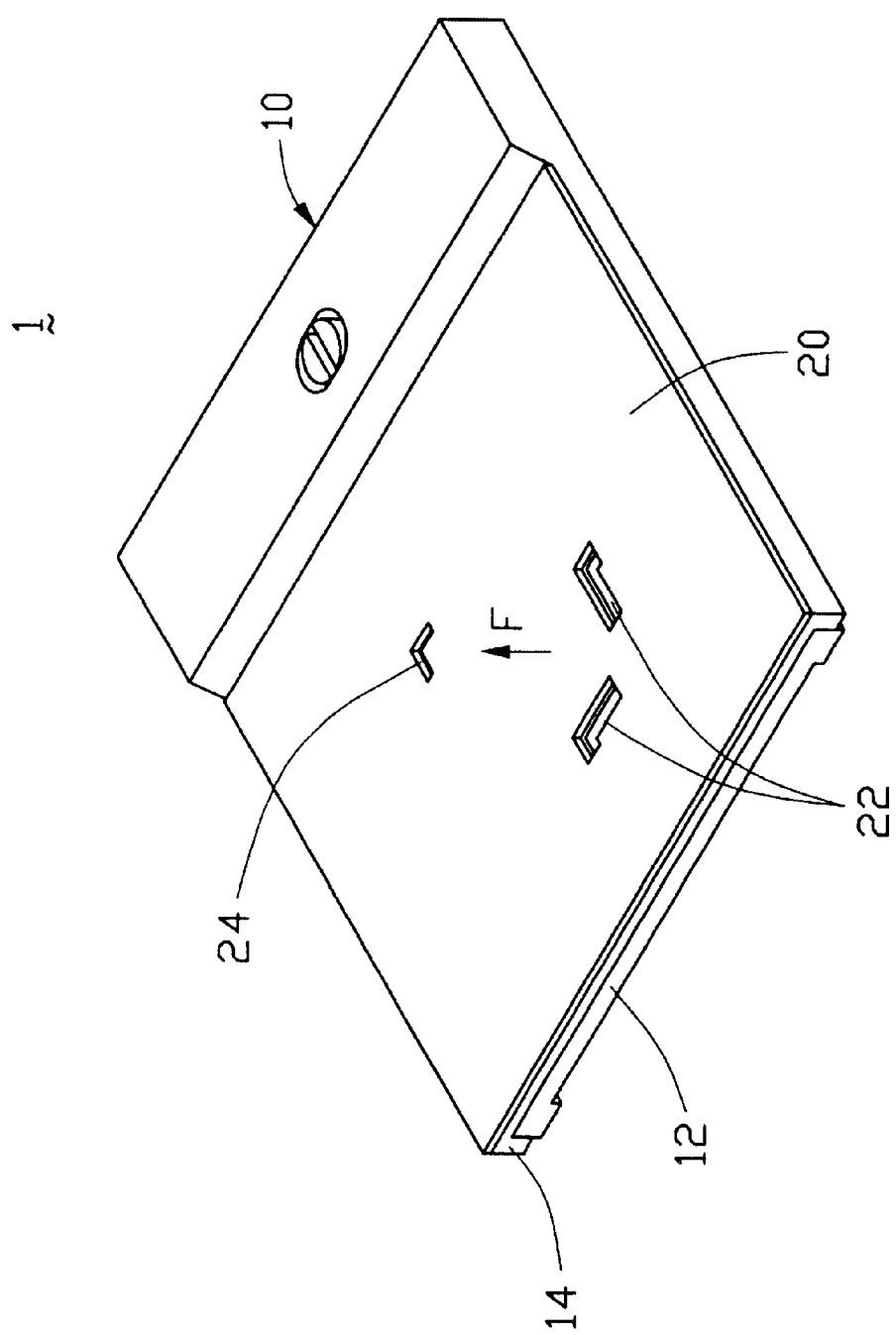
FIG. 5 is an assembled view of FIG. 1.
Figure 6:
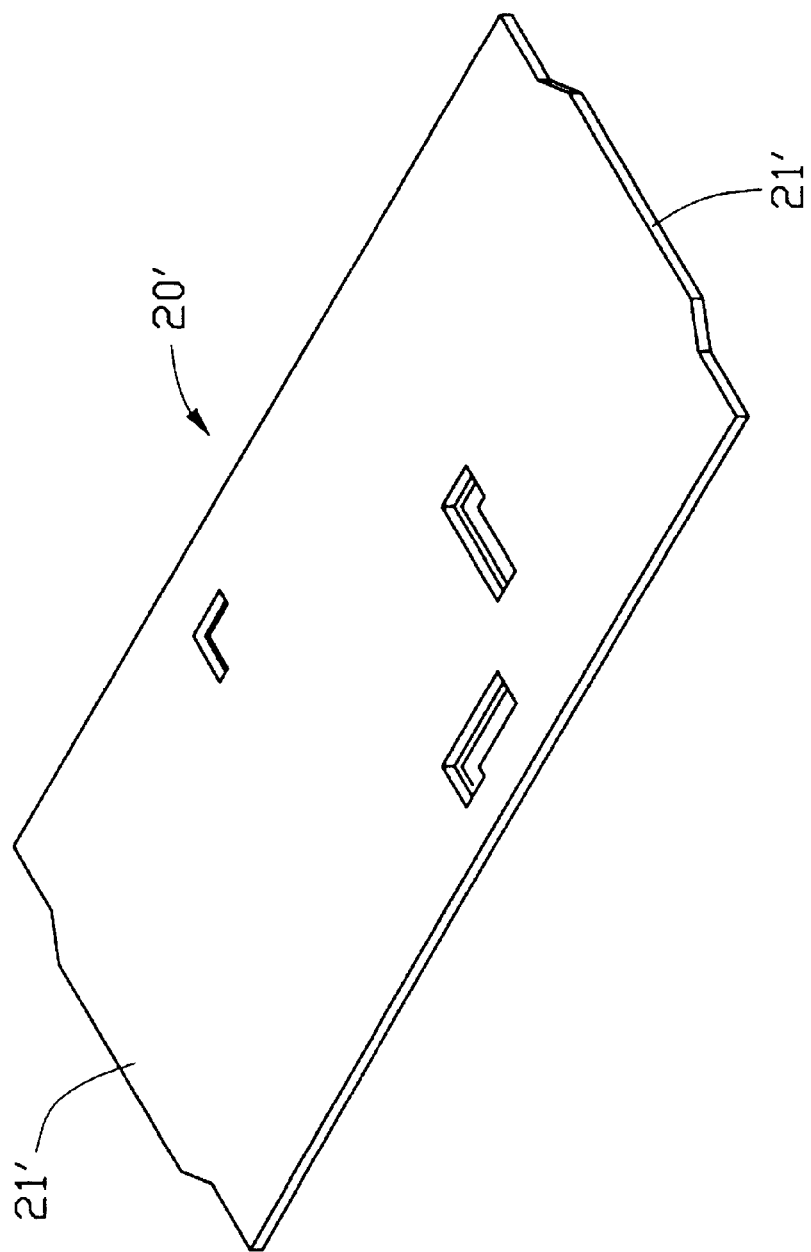
FIG. 6 is an enlarged perspective view of a pick up cap in a second preferred embodiment of the present invention.

In assembly, referring to FIGS. 4 to 6, the pick up cap 20 is firstly horizontally inserted toward the cover 10 and the protrusion 292 of the embossment 29 thereof is firstly and horizontally latched into the "L"-shaped recess 16 of the cover 10, indicated as an arrow line F. Frequently, the elongate blocks 28 of the cover 20 are abutted against the corresponding side edges 13 of the cover 20. Then, the latching tabs 262 of the pair of resilient beams 26 are latched into corresponding cutouts 17 of the cover 14. Thus, an assembled socket assembly 1 is obtained as shown in FIG. 5, and the pick up cap 20 is reliably fastened on the cover 14 of the socket 10 and the latching means thereof, such as the embossment 29 and the resilient arms 26 thereof, can not be easily damaged due to such a relative horizontal insertion. Thus, the socket assembly 1 is appropriately positioned on the circuit board by a vacuum suction nozzle (not shown).

It is easy understood that the pick up cap 20 do not have to totally cover the CPU socket 10 and may partially cover the CPU socket 10 as desired. As shown in FIG. 6, a modified pick up cap 20' has a similar structure as the pick up cap 20 except that its size is smaller than the later and has a pair of horns 21' to be grabbed during operating or using.

It is to be understood, however, that even though numerous characteristics and advantages of the present invention have been set forth in the foregoing description, together with details of the structure and function of the invention, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. A central processing unit (CPU) socket assembly for being assembled on a circuit board by a vacuum suction device, comprising:

a CPU socket having a cover, the cover defining a central opening, a recess and at least one cutout, the recess and the at least one cutout communicated with the central opening; and a pick up cap being horizontally assembled with the cover and forming an embossment and at least one resilient beam for engaging with the recess and the at least one cutout of cover, respectively;

wherein the central opening is defined by four inner side edges of the cover;

wherein the recess is defined at a boundary portion of two adjacent side edges, and the at least one cutout includes a pair of cutouts defined in other two adjacent side edges;

wherein the pick up cap defines a slit and a pair of slots respectively corresponding to the recess and the pair of cutouts of the cover, both the slit and the slots extending through opposite top and bottom surfaces of the cover;

wherein the embossment and the pair of resilient beams are formed in a bottom surface of the pick up cap and respectively corresponding to the slit and the pair of slots, the embossment having a protrusion to be horizontally latched into the recess of the cover.

2. The CPU socket assembly as claimed in claim 1, wherein each slot forms a recessed section at one end thereof, and a corresponding resilient beam forms a latching tab extending toward the recessed section for latching into a corresponding cutout of the cover after the embossment has engaged with the recess of the cover.

3. The CPU socket assembly as claimed in claim 1, wherein a pair of elongate blocks are formed on the pick up cap for being abutted against by corresponding inner side edges of the cover.

4. A method for assembling a pick up cap with a central processing unit (CPU) socket to be mounted on a circuit board, the CPU socket including a cover having a rectangular opening defined by four inner side edges thereof, the method comprising steps of:

defining a plurality of recesses in the inner side edges of the cover;

forming a plurality of latching members on the pick up cap and corresponding to the recesses of the cover;

horizontally latching one of the latching members of the pick up cap into a corresponding recess of the cover; and inserting other latching members of the pick up cap into other corresponding recesses of the cover;

wherein the step of forming comprises forming an embossment and a pair of resilient beams corresponding to the L-shaped recess in two inner adjacent side edges and the pair of elongate recesses in other two inner adjacent side edges of the cover, respectively;

wherein the step of latching comprises horizontally latching the embossment of the pick up cap into the L-shaped recess of the cover.

5. The method as claimed in claim 4, wherein the step of inserting comprises inserting the pair of resilient beams of the pick up cap into corresponding elongate recesses of the cover.

6. A socket assembly comprising:

a CPU socket defining a central rectangular opening circumferentially confined by first, second, third and fourth edges;

a recess formed at the first edge;

a cutout formed at the second edge, said cutout being spaced from said recess with a distance not less than one half of a length of either of said first, second, third and fourth edges;

a pick-up cap including a plate from which a rigid embossment downwardly extends in vertical alignment with the recess to engage the recess first in a first stage, and a resilient latch downwardly extends in vertical alignment with the cutout to engage the cutout successively in a second stage so that the pick-up cap is retainably mounted upon the socket in a parallel relationship;

wherein another cutout is formed on the third edge and the pick-up cap forms another resilient latch in vertical alignment with said another cutout, wherein said rigid embossment and said two resilient latches constitute a three points retention relative to the socket;

wherein said recess is formed around a corner of said rectangular opening;

wherein said cutout is formed close to another corner of said rectangular opening diagonally opposite to said corner.

7. The socket assembly as claimed in claim 6, wherein said socket includes a moveable top cover, and the recess and the cutout are formed in said top cover.

\* \* \* \* \*